(12) United States Patent
Brantner

(10) Patent No.: US 7,102,271 B2
(45) Date of Patent: Sep. 5, 2006

(54) METHOD AND APPARATUS FOR A HIGH OUTPUT SENSOR SYSTEM

(75) Inventor: Paul C. Brantner, Conifer, CO (US)

(73) Assignee: Infinite Power Solutions, Inc., Golden, CO (US)

( * ) Notice: Subject to any disclaimer, the term of this patent is extended or adjusted under 35 U.S.C. 154(b) by 31 days.

(21) Appl. No.: 10/762,278

(22) Filed: Jan. 23, 2004

(65) Prior Publication Data

US 2005/0179341 A1    Aug. 18, 2005

Related U.S. Application Data

(60) Provisional application No. 60/536,250, filed on Jan. 14, 2004.

(51) Int. Cl.
*H01L 41/08* (2006.01)

(52) U.S. Cl. .................................................... 310/319

(58) Field of Classification Search ................ 310/319, 310/334, 329, 338, 339
See application file for complete search history.

(56) References Cited

U.S. PATENT DOCUMENTS

| | | | | |
|---|---|---|---|---|
| 3,463,942 A | * | 8/1969 | Mellon | 310/329 |
| 3,559,027 A | | 1/1971 | Arsem | |
| 3,701,903 A | * | 10/1972 | Merhar | 307/9.1 |
| 3,940,637 A | | 2/1976 | Ohigashi et al. | |
| 3,976,899 A | | 8/1976 | Fanshawe | |
| 4,127,424 A | | 11/1978 | Ullery, Jr. | |
| 4,185,621 A | * | 1/1980 | Morrow | 600/485 |
| 4,226,924 A | | 10/1980 | Kimura et al. | |
| 4,239,974 A | | 12/1980 | Swander et al. | |
| 4,320,477 A | | 3/1982 | Baumgartner | |
| 4,360,860 A | | 11/1982 | Johnson et al. | |
| 4,402,524 A | * | 9/1983 | D'Antonio et al. | 280/612 |
| 4,409,548 A | * | 10/1983 | Focht | 324/168 |
| 4,467,236 A | * | 8/1984 | Kolm et al. | 310/321 |
| 4,500,838 A | * | 2/1985 | Bloomer | 324/117 R |
| 4,504,761 A | * | 3/1985 | Triplett | 310/339 |
| 4,523,261 A | | 6/1985 | West | |
| 4,612,472 A | | 9/1986 | Kakizaki et al. | |
| 4,701,835 A | | 10/1987 | Campagnuolo et al. | |
| 4,893,049 A | * | 1/1990 | Bundy et al. | 310/338 |
| 4,943,752 A | | 7/1990 | Todd et al. | |
| 5,039,928 A | | 8/1991 | Nishi et al. | |
| 5,053,693 A | * | 10/1991 | Bohnert et al. | 324/96 |

(Continued)

FOREIGN PATENT DOCUMENTS

EP    0 673 102 A    9/1995

(Continued)

OTHER PUBLICATIONS

Starner, "Human-powered wearable computing" 35 (3 & 4) IBM Sys. J. 618-29 (1996).

*Primary Examiner*—Mark Budd
(74) *Attorney, Agent, or Firm*—Schwartz Sung & Webster

(57) ABSTRACT

The present invention relates to the field of motion/movement sensors, detectors, and/or monitors, as well as other types of sensors. In particular, the present invention may provide, for example, a large pulsed output voltage in response to very low (or slow) sensed movement or environment changes, such as, temperature, pressure, and energy. The present invention relates, for example, to other available sensors and may provide an output high enough to turn on related processing circuitry from an "OFF" state. The present invention relates, among other things, to sensing various events via, for example, axially poled homopolymer polyvinyladine fluoride (PVDF) or other piezoelectric materials.

53 Claims, 10 Drawing Sheets

U.S. PATENT DOCUMENTS

| | | |
|---|---|---|
| 5,065,067 A | 11/1991 | Todd et al. |
| 5,092,243 A | 3/1992 | Hawkins et al. |
| 5,389,850 A * | 2/1995 | Wilmer .................. 310/329 |
| 5,512,795 A * | 4/1996 | Epstein et al. ............ 310/339 |
| 5,552,656 A | 9/1996 | Taylor |
| 5,801,475 A * | 9/1998 | Kimura .................. 310/319 |
| 5,838,138 A | 11/1998 | Henty |
| 6,198,205 B1 | 3/2001 | Oberlin et al. |
| 6,307,142 B1 | 10/2001 | Allen et al. |
| 6,342,776 B1 | 1/2002 | Taylor et al. |
| 6,411,016 B1 * | 6/2002 | Umeda et al. ............ 310/339 |
| 6,433,465 B1 | 8/2002 | McKnight et al. |
| 6,737,789 B1 | 5/2004 | Radziemski et al. |
| 2002/0009320 A1 | 1/2002 | Ahmed |

FOREIGN PATENT DOCUMENTS

| | | |
|---|---|---|
| GB | 2 095 053 A | 9/1982 |
| JP | 63-310336 A | 12/1988 |
| JP | 07-114437 A | 5/1995 |
| JP | 09-139139 A | 5/1997 |
| JP | 10-283870 A | 10/1998 |
| JP | 2001-154783 A | 6/2001 |
| JP | 2001-327197 A | 11/2001 |
| JP | 2002-218769 A | 8/2002 |

* cited by examiner

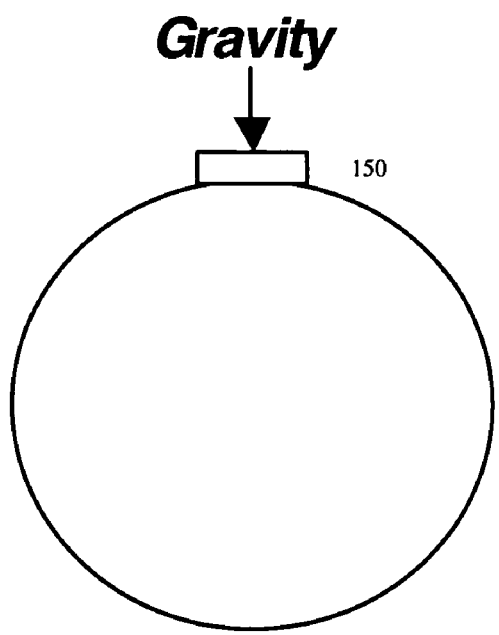 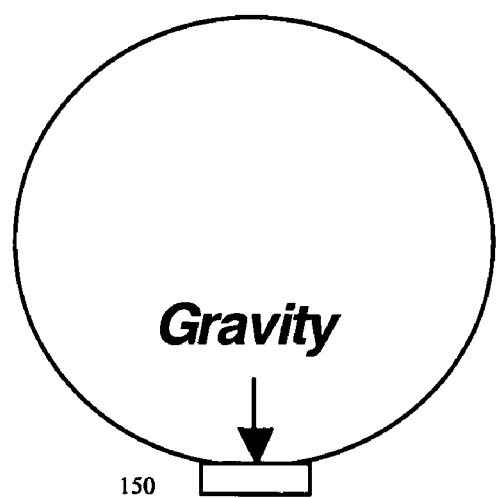
Figure 8A                    Figure 8B

METHOD AND APPARATUS FOR A HIGH OUTPUT SENSOR SYSTEM

CROSS REFERENCE TO RELATED APPLICATIONS

The present application is related to and claims the benefit, under 35 U.S.C. § 119, of U.S. Provisional patent Application Ser. No. 60/536,250, filed 14 Jan. 2004, which is expressly incorporated fully herein by reference.

FIELD OF THE INVENTION

The present invention relates to the field of motion/movement sensors, detectors, and/or monitors, as well as other types of sensors. In particular, the present invention may provide, for example, a large pulsed output voltage in response to very low (or slow) sensed movement or environment changes, such as, temperature, pressure, and energy. The present invention relates, for example, to other available sensors and may provide an output high enough to turn on related processing circuitry from an "OFF" state. The present invention relates, among other things, to sensing various events via, for example, axially poled homopolymer polyvinyladine fluoride (PVDF) or other piezoelectric materials.

BACKGROUND OF THE INVENTION

Presently, there are certain devices available that use piezoelectric active materials to sense various events. Energy pulses from these devices are generally very low in voltage and require the monitoring circuit to be in an "ON" state, generally incorporating an amplifier to allow the circuit to recognize a sensed event. Previous devices for sensing use a significant amount of continuous energy (quiescent current).

Numerous piezoelectric sensors exist. In general, these sensors fall into two overlapping categories. They either require an amplifier to boost the signal from the piezoelectric material, or require a bias signal from which the piezoelectric material's signal subtracts or adds. Each of these techniques requires that the sensor be "ON," drawing current at all times. Thus, a need exists for a sensor that can avoid the use of an amplifier or a bias signal.

Because a piezoelectric event generally produces only small amounts of energy, the detection of low frequency events has previously required significant amplification. Thus, a need exists for a sensor that can detect low frequency events without the aid of amplification.

SUMMARY OF THE INVENTION

The present invention may relate, for example, to using an unassisted piezoelectric device as a sensor, monitor or detector. In comparison to the prior art, the present invention may allow, for example, a significantly larger voltage pulse to be sent to the monitor circuitry, large enough to be used to switch the entire circuit from an "OFF" state to an "ON" state, thereby cutting quiescent current usage to extremely low levels and allowing the use of significantly smaller sensor power systems. The output of the sensor of the present invention may, for example, be used to turn "ON" the sensor circuit from an "OFF" state. The present invention may also relate to a sensing device that allows the use of non-amplified sensor output signals in a monitoring circuit in the "ON" state, to be recognized when the sensor is in an "OFF" state. This may be accomplished regardless of the polarity of the signals, and may be accomplished by the beneficial effect of stacking available sensor element outputs and using the summed output to turn "ON" a switching device. The switching device may then turn "ON" the entire monitoring circuit.

Sensing can be accomplished with, and is not limited to, positive or negative changes of the following energy types: thermal; visible light, including infrared or ultraviolet; mechanical motion or impact; triboelectric, including airflow or physical contact; acceleration; and radio frequency (RF) electromagnetic energy, regardless of specific frequency. The elements of various embodiments of this invention potentially include, for example, size of piezoelectric material, mechanical mounting and coupling of piezoelectric material, energy translation into useful pulses at required voltage levels, regulation (voltage or current), and filtering (if necessary), each of which may, for example, be tuned to fit or combine with required outputs in any specific event to be sensed.

There may be significant advantages to stacking low frequency or low voltage sensor outputs. For example, stacking low frequency or low voltage sensor outputs allows the use of local sensor events (positive or negative) that were previously not of sufficient charge value or voltage levels to be useable in even the lowest voltage circuitry without amplification.

Another advantage of the present invention may be that the present invention may be adapted to operate when supplied with relatively small amounts of energy. An example energy source for this invention includes longitudinal stretch motion relative to the object on which an embodiment of the present invention may be mounted. This stretch may supply energy for longitudinal movements as small as 1.5 µm. Furthermore, in applications based on temperature change, the charge stacking characteristic of the present invention may output pulses based on a relatively small temperature change. In a stacked element array, the temperature change may be the same for all elements. For example, in a five-element stack, a 0.2° Celsius (one fifth degree) change may produce an approximate 8 volt open circuit output pulse. Thus, in an "n" element stack, a 1/n Celsius change may produce an 8 volt open circuit output pulse.

An object of an embodiment of the present invention is to provide a sensing device that may be optimized for almost any event. It is another object of an embodiment of the present invention to provide a sensing device for robotic feeling. The present invention may be useful in robotic feeling applications because the sensor does not require energy to be expended when there is no sensation present. Additionally, the present invention may be capable of detecting very small or low frequency events. This detection capability may be useful for robotic tactile or other sensors for use in handling delicate or otherwise complex situations.

One embodiment of the present invention may be an apparatus for use as a sensor including a plurality of stacked piezoelectric elements, a rectification block on an output of each of the elements, and a plurality of capacitors arranged to accumulate charge from the rectification blocks. Moreover, in certain embodiments, a switching device may be connected to an output of the plurality of capacitors. Although the invention is described in terms of the use of capacitors, the invention may, for example, be implemented by other circuit components that have inherent capacitance. Thus, any element that has a useful capacitance may be considered a capacitive element.

In a particular embodiment of the present invention, the rectification block may be a full-wave rectification block or a half-wave rectification block. The apparatus may include two or more stacked piezoelectric elements. Moreover, in a further embodiment of the present invention, the apparatus may further include a signal phase delay element (such as, for example, an inductor) provided between the rectification blocks and the capacitors. In another particular embodiment of the present invention, the switch device may comprise a transistor or group of transistors.

The apparatus may be optimized to detect, monitor and/or sense changes in position of an item or structure upon which it is mounted. A door or window may be examples of such structures. Should the door or window be moved even slightly, the sensor of an embodiment of the present invention may provide an output. An appropriate angle to mount an embodiment of the present invention to the surface of the item or structure being monitored may be approximately perpendicular or approximately 90 degrees to the plane of movement to be monitored.

The apparatus of an embodiment of the present invention may be optimized for detecting, monitoring and/or sensing changes in position of an item or structure that it is placed upon it. Any item or structure that is placed upon the sensor of an embodiment of the present invention may provide a preload of the device that will be changed if the item or structure is moved from the initial position. An example of such an item to be monitored is a museum antiquity. If the antiquity is moved, the sensor may provide a desired output. The sensor of this embodiment of the present invention may also be configured to avoid certain forms of detection. For example, devices that constantly draw current may emit undesired electromagnetic radiation. This electromagnetic radiation can be "seen" by a variety of sensors. However, certain embodiments of the present invention may avoid such detection by not drawing any current (or drawing mere nanoamps) in an untriggered state, thus making detection less likely.

An embodiment of the present invention may also be optimized for detecting changes in position from gravitational effects on a structure rotating at an angle to the surface of a significant gravity source. A wheel is an example of a structure that may be the target for detection of changes in position by an embodiment of the present invention. An appropriate angle to the surface for this embodiment may be approximately perpendicular, or approximately 90 degrees. Such an angle may provide the maximum amount of change in position in relation to the gravity plane. In general, if other angles are used, the useful component for measuring may be the component perpendicular to the surface of the gravity source. Significant gravity sources may include the earth, the moon, an asteroid, or other bodies significantly larger than the target.

The apparatus of an embodiment of the present invention may also be optimized to measure or detect changes in frequency or amplitude from a human or other animal heartbeat. The apparatus may alternatively be optimized for changes in energy available and/or detectable from local electrical fields. In another embodiment, the apparatus of the present invention may be optimized to detect, sense, or monitor changes in frequency or amplitude available from low power sound or ultrasound energy. In yet another embodiment, an apparatus of the present invention may be optimized for detecting, sensing, or monitoring changes in frequency or amplitude available from RF spectrum energy fields. In another embodiment, the apparatus of the present invention may be optimized to monitor, detect or sense changes in magnetic fields. Additionally, the apparatus may be optimized to monitor, detect or sense very low frequency energy, down to, for example, the limit of any particular piezoelectric material. This limit for DT-1 type material from Measurement Specialties Incorporated, for example, is believed to be approximately 0.001 Hz.

In certain embodiments of the present invention, the apparatus may incorporate circuit board technology. For example, the rectification blocks may be implemented in a circuit board. In such an embodiment, the device's capacitive, resistive (if any), or inductive elements may be part of the circuit board or traces upon the circuit board, rather than discrete components. Additionally, inductors may be incorporated in certain embodiments. These may be particularly useful in adjusting the phase of the energy from each element in the stack and may aid in preventing the output of one element from canceling a portion of the output from another element.

Another embodiment of the present invention may include a method of manufacturing a sensor including, for example, the steps of arranging a plurality of piezoelectric elements into a stack, connecting a rectification block on an output of each of the elements, and arranging a plurality of capacitors to accumulate charge from the rectification blocks. A further embodiment of the present invention may include, for example, the step of connecting a switching device to an output of the plurality of capacitors. In a particular embodiment of the present invention, the step of arranging may include providing said plurality of piezoelectric elements arranged in a stack according to size.

It is understood that both the foregoing general description and the following detailed description are exemplary and explanatory only and are not restrictive of the invention as claimed. The accompanying drawings illustrating an embodiment of the invention together with the description serve to explain the principles of the invention.

BRIEF DESCRIPTION OF THE DRAWINGS

FIGS. 8A and 8B are layouts depicting a charge device of an embodiment of the present invention optimized for sensing positional change mounted on a wheel at 90° to the surface of the earth or other significant mass (planets, moons, asteroids, etc.).

DETAILED DESCRIPTION OF THE INVENTION

Figure 1:
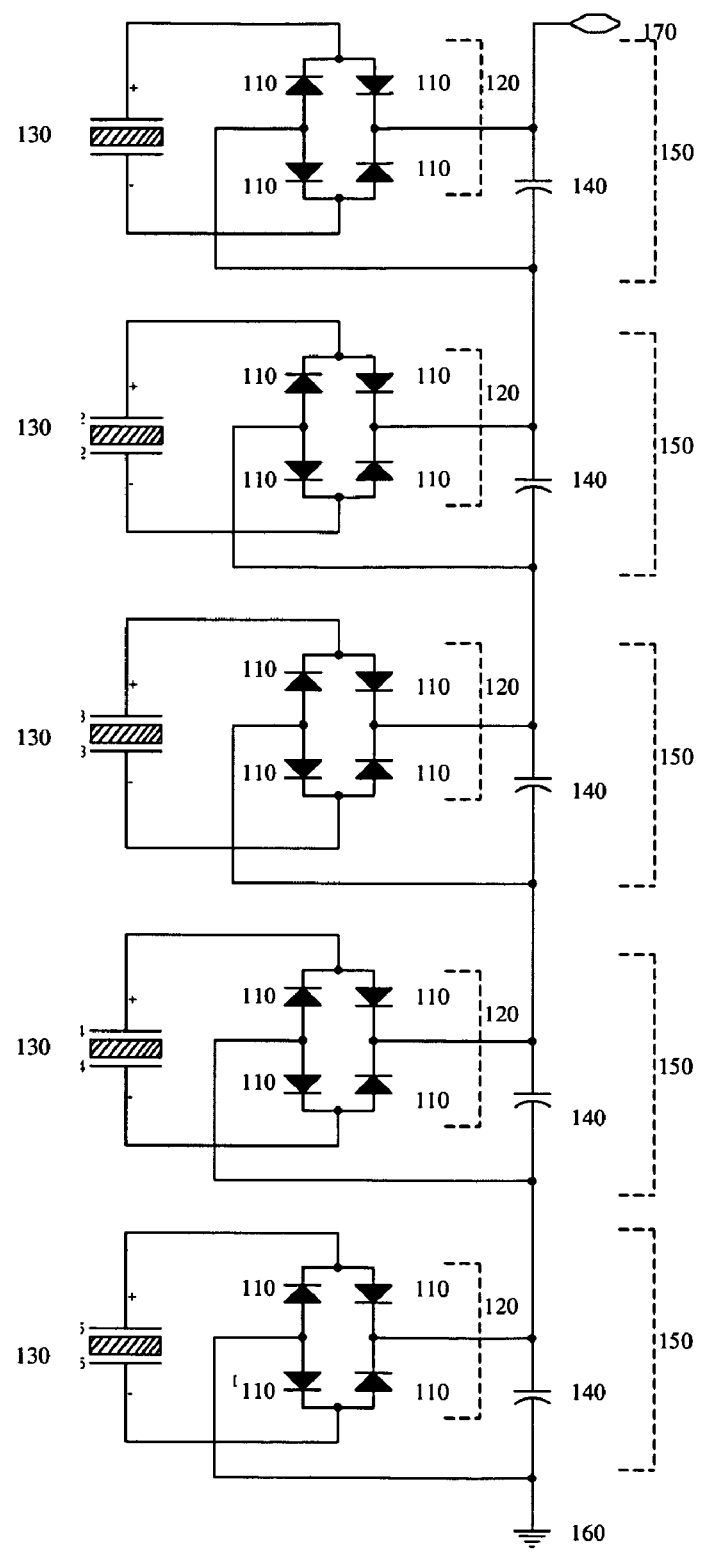
FIG. 1 is a schematic diagram of a five-element stack within an embodiment of the present invention.

It is to be understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. All references cited herein are incorporated by reference herein in their entirety.

As described in this specification, applied force is shown as being in the same general direction and magnitude to each element. The type of force is immaterial to this explanation and thus a generic force vector will be used. Cases involving a different force applied versus film area or changes in force direction may readily be inferred from this case by an ordinarily skilled artisan. Small variables due to discrete component characteristics are not shown as specific component values because they can vary; and further because, although this may optimize performance, it does not affect primary performance.

In general, force applied to a PVDF film may cause longitudinal motion of at least a portion of the film. This longitudinal displacement of a portion of the film can generate a voltage output. The magnitude of the voltage output depends, for example, on the force applied, the physical dimension of the PVDF film, and the capacitance of the film. The PVDF film may be coated with a conductive surface to remove Coulombs of charge. In another embodiment, the PVDF film may be in contact with a conductor to remove charge. This process may be reversible, thus, for example, voltage applied to a conductively coated PVDF film surface may cause physical motion in the film. In axially poled PVDF, most of such voltage induced movement may be in the longitudinal direction. Typically only about 1/1000 of the movement will be in any other direction. PVDF film that may be used in accordance with the present invention may be such film as DT-1 film from Measurement Specialties Incorporated.

FIG. 1 is a circuit diagram of an embodiment of the present invention. The diagram illustrates one way in which five piezoelectric elements 150 may be electrically connected together. Although the piezoelectric elements 150 are similar to each other, they are not identical. The segments of piezoelectric material 130 may be of increasing size and the capacitors 140 may be selected to correspond to the particular segment of piezoelectric material 130. An example of such an arrangement is described in FIGS. 7A, 7B, and 7C, which is further described below. Referring again to FIG. 1, each piezoelectric element 150 may include a bridge rectifier 120. The bridge rectifier 120 may, for example, be a full-wave rectifier including four diodes 110. The bridge rectifier 120 may be connected to the piezoelectric material 130, and may be connected to a capacitor 140. A stacked array of piezoelectric elements 150 may be connected electrically by connecting their capacitors 140 in series. One terminal of one of the capacitors 140 may be provided as a sensor output 170, and another may be connected to ground 160. It may be observed that a four element stack may be created by removing the connection between the bottommost piezoelectric element 150 and instead connecting directly to ground.

Figure 2A:
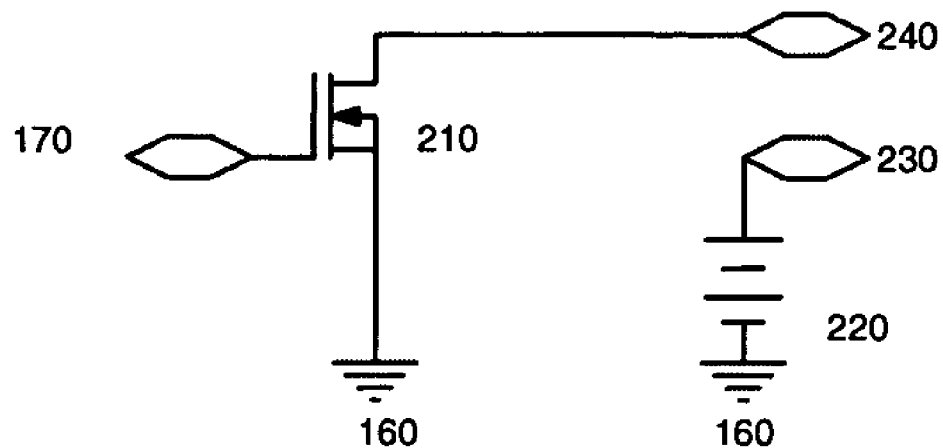
FIGS. 2A and 2B are schematic diagrams of FET Ground Switching embodiments of the present invention.
Figure 2B:
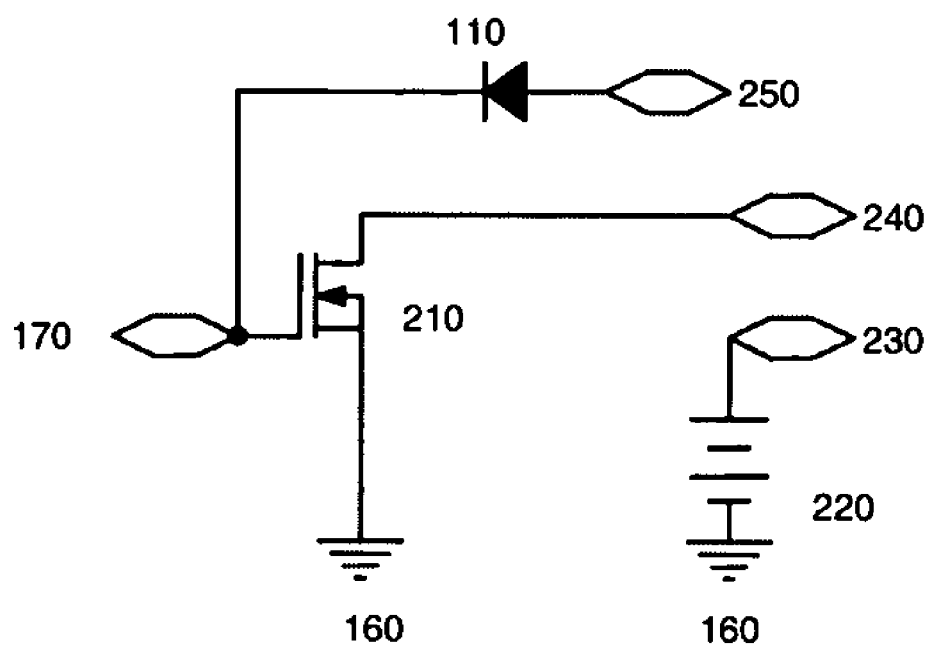

FIGS. 2A and 2B provide two examples of ground switching applications of the present invention: a single pulse diagram in FIG. 2A, and a latched power diagram in FIG. 2B. In one embodiment, as shown, for example, in FIG. 2A, the sensor output 170 may be connected to the gate of an N Channel FET 210. The source of the N Channel FET 210 may be connected to ground 160. The drain of the N Channel FET 210 may be connected to monitor circuit ground 240. A battery 220 may provide a voltage differential between monitor circuit power 230 and ground 160. Thus, a sensor high pulse from the sensor output 170 may apply the monitor circuit ground for the pulse duration.

In another embodiment, as shown, for example, in FIG. 2B, the sensor output 170 may be connected to the gate of an N Channel FET 210. The source of the N Channel FET 210 may be connected to ground 160. The drain of the N Channel FET 210 may be connected to monitor circuit ground 240. A battery 220 may provide a voltage differential between monitor circuit power 230 and ground 160. Additionally, a monitor circuit power latch 250 may be connected through a diode 110 to the gate of the N Channel FET 210. Thus, the high pulse from sensor output 170 may indirectly activate the monitor circuit power latch 250, enabling the circuit to latch power beyond the duration of the pulse.

Figure 3A:
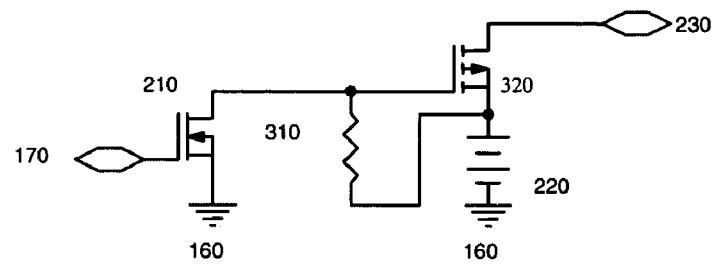
FIGS. 3A, 3B, and 3C are schematic diagrams of FET Power Switching embodiments of the present invention.
Figure 3B:
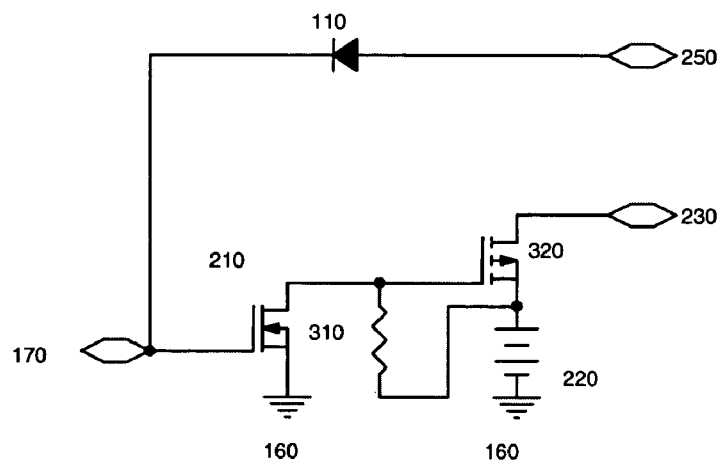
Figure 3C:
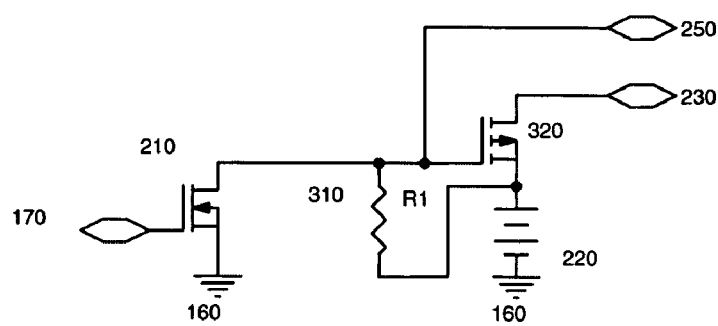

FIGS. 3A, 3B, and 3C provide three examples of power switching application of the present invention: a single pulse diagram in FIG. 3A, an active-high power latching diagram in FIG. 3B, and an active-low diagram in FIG. 3C. In one embodiment, as shown, for example, in FIG. 3A, the sensor output 170 may be connected to the gate of an N Channel FET 210. The source of the N Channel FET 210 may be connected to ground 160. The drain of the N Channel FET 210 may be connected to a resistor 310 and the gate of a P Channel FET 320. The resistor 310 may be connected to the source of the P Channel FET 320. The source of the P Channel FET 320 may also be connected to a battery 220 which may, in turn, be connected to ground 160. The drain of the P Channel FET 320 may be connected to monitor circuit power 230. Thus, a sensor high pulse may apply monitor circuit power 230 for the pulse duration.

In another embodiment, as shown, for example, in FIG. 3B, the sensor output 170 may be connected to the gate of an N Channel FET 210. The source of the N Channel FET 210 may be connected to ground 160. The drain of the N Channel FET 210 may be connected to a resistor 310 and the gate of a P Channel FET 320. The resistor 310 may be connected to the source of the P Channel FET 320. The source of the P Channel FET 320 may also be connected to a battery 220 which may, in turn, be connected to ground 160. The drain of the P Channel FET 320 may be connected to monitor circuit power 230. Thus, a sensor high pulse may apply monitor circuit power 230 for the pulse duration. Additionally, a monitor circuit power latch 250 may be connected through a diode 110 to the gate of the N Channel FET 210. Thus, the high pulse from sensor output 170 may indirectly activate the monitor circuit power latch 250, enabling the circuit to latch power beyond the duration of the pulse.

In another embodiment, as shown, for example, in FIG. 3C, the sensor output 170 may be connected to the gate of an N Channel FET 210. The source of the N Channel FET 210 may be connected to ground 160. The drain of the N Channel FET 210 may be connected to a resistor 310 and the gate of a P Channel FET 320. The resistor 310 may be connected to the source of the P Channel FET 320. The source of the P Channel FET 320 may also be connected to a battery 220 which may, in turn, be connected to ground 160. The drain of the P Channel FET 320 may be connected to monitor circuit power 230. Thus, a sensor high pulse may apply monitor circuit power 230 for the pulse duration. Additionally, a monitor circuit power latch 250 may be connected to the gate of the P Channel FET 320. Thus, the high pulse from sensor output 170 may indirectly activate the monitor circuit power latch 250, enabling the circuit to latch power beyond the duration of the pulse.

Figure 4A:
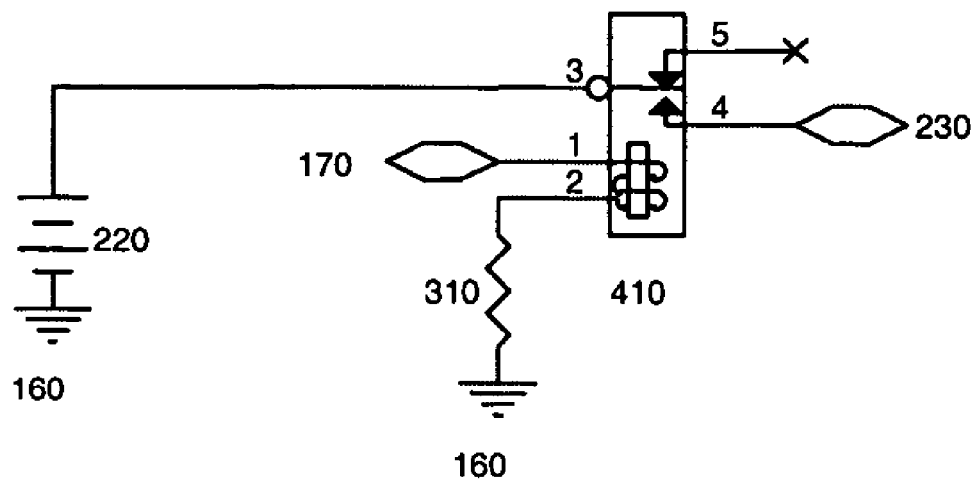
FIGS. 4A and 4B are schematic diagrams of Relay Power Switching embodiments of the invention.
Figure 4B:
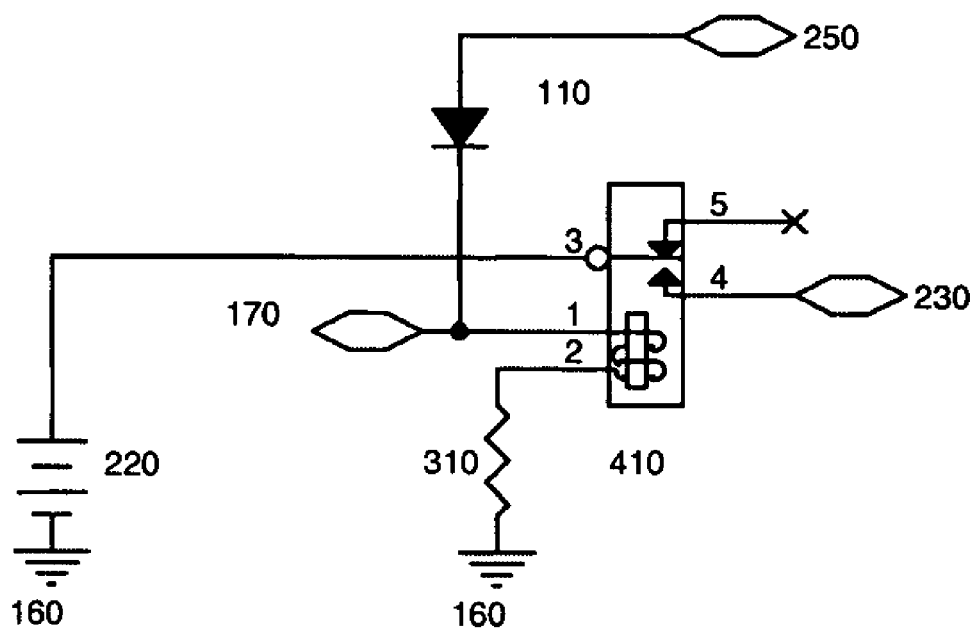

FIGS. 4A and 4B provide two examples of relay power switching applications of the present invention: a single pulse diagram in FIG. 4A, and a latched power diagram in FIG. 4B. In one embodiment, as shown, for example, in FIG. 4A, a sensor output 170 may be attached to a relay 410 at pin one. A resistor 310 may be connected between the relay 410 at pin two and ground 160. A battery 220 may be connected between the relay 410 at pin three and ground 160. The relay 410 at pin five may remain open. The relay 410 at pin four may be connected to monitor circuit power 230. Thus, a sensor high pulse may apply the monitor circuit power for the pulse duration.

In another embodiment, as shown, for example, in FIG. 4B, a sensor output 170 may be attached to a relay 410 at pin one. A resistor 310 may be connected between the relay 410 at pin two and ground 160. A battery 220 may be connected between the relay 410 at pin three and ground 160. The relay 410 at pin five may remain open. The relay 410 at pin four may be connected to monitor circuit power 230. Additionally, a monitor circuit power latch 250 may be connected via a diode 110 to the relay 410 at pin one. Thus, a sensor high pulse may apply the monitor circuit power for the pulse duration. Thus, the high pulse from sensor output 170 may indirectly activate the monitor circuit power latch 250, enabling the circuit to latch power beyond the duration of the pulse.

Figure 5A:
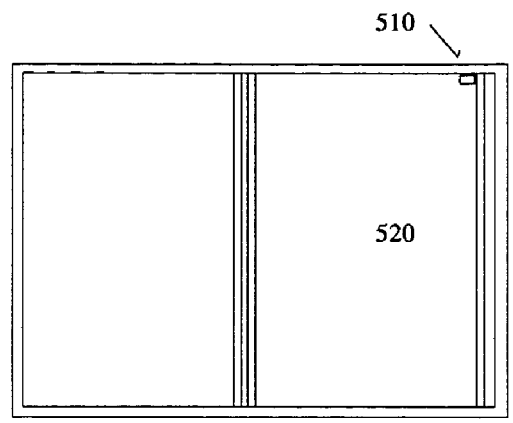
FIGS. 5A and 5B are examples of motion/movement sensing embodiments of the invention including a sensor mounted on an object to sense movement.
Figure 5B:
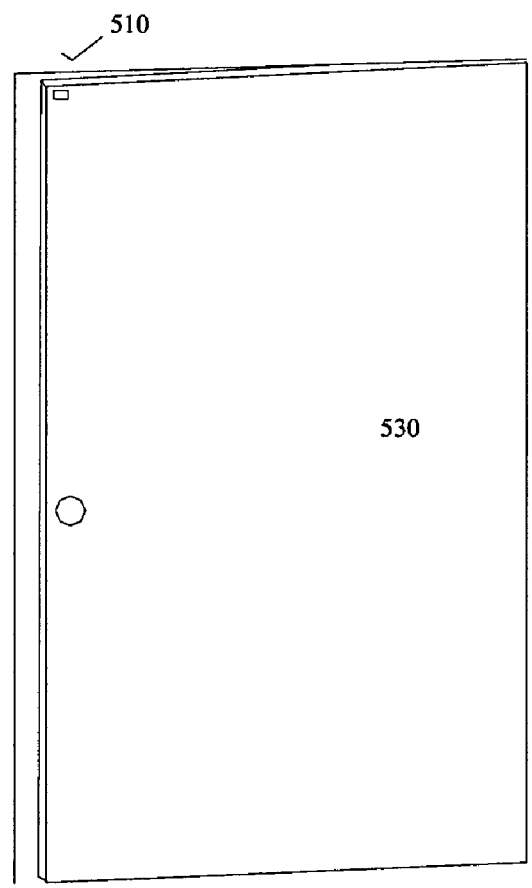

FIGS. 5A and 5B provide two examples of motion sensing with the sensor mounted on the object of interest: a window example in FIG. 5A and a door example in FIG. 5B. In one embodiment, as shown, for example, in FIG. 5A, the sensor 510 may be mounted on a portion of the window 520. In one embodiment, the sensor 510 may be disguised as a sticker that is advertising a security company. In another example, the sensor 510 may be placed on an opaque portion of the window 520.

In another embodiment, as shown, for example, in FIG. 5B, a sensor 510 may be placed on a door 530. The sensor 510 may, for example, be attached by means of an adhesive. The sensor 510 may be placed on a portion of the door 530 that is particularly likely to move in the event that there is an attempt made to open or shut the door 530.

Figure 6:
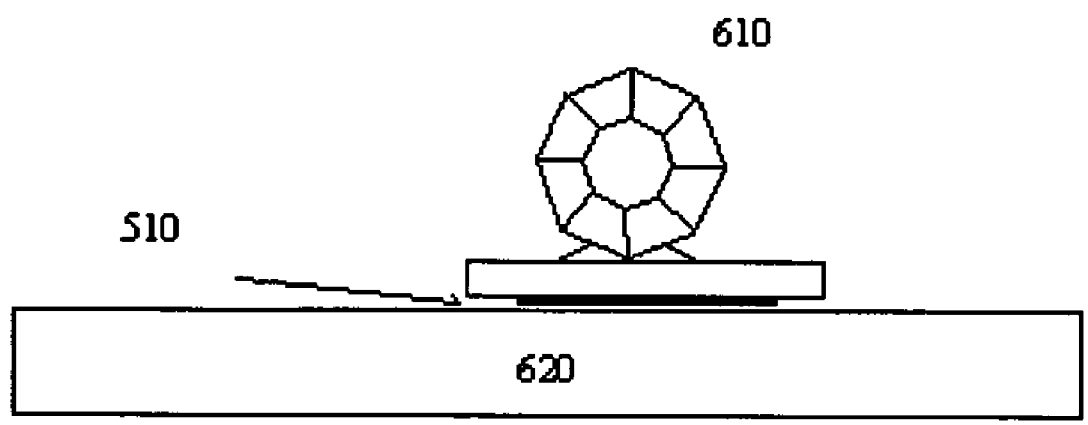
FIG. 6 is a drawing of an example of motion/movement sensing by an embodiment of the invention including a sensor placed below an object to sense movement of the object in relation to the sensor.

FIG. 6 is an example of a sensor 510 that is pre-loaded by being placed beneath an object of interest: in this case, a diamond 610. The sensor 510 may initially be placed on the surface of, for example, a pedestal 620. In this embodiment, if the diamond 610 is lifted from the pedestal 620, the sensor 510 will provide an output.

Figure 7A:
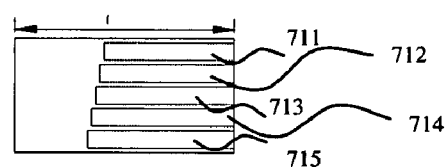
FIGS. 7A, 7B, and 7C are a mechanical drawing of a five-element stack, one type of physical PVDF layout of and embodiment of the present invention.
Figure 7B:
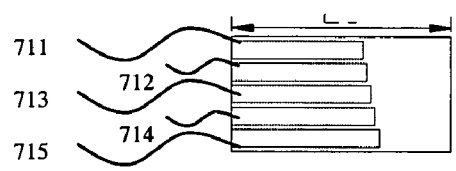
Figure 7C:
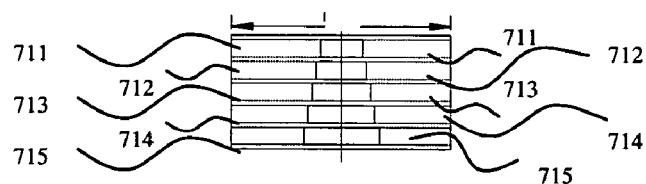

FIGS. 7A, 7B, and 7C are drawings of a five-element stack. FIG. 7A corresponds to a top view of a five-element stack. FIG. 7B corresponds to a bottom view of a five-element stack. Finally, FIG. 7C shows the application of force though a force application center 720 in view that superimposes top and bottom views. This embodiment, for example, converts ambient mechanical energy. A single PVDF film may be sectioned into five segments of increasing lengths as shown. These segments (or elements) 711, 712, 713, 714, and 715 (which may correspond to particular segments of piezoelectric material 130 in FIG. 1) may be ordered from smallest to largest as depicted. Elements may be created in different sizes to provide specifically higher voltages as the film size increases for an evenly applied force across the PVDF film. This permits the stack to obtain a positive charge from top to bottom (for example, from the sensor output 170 to ground 160 in circuit diagram, FIG. 1). Capacitors 140 (as shown in FIG. 1) may preferably be matched in size to the specific capacitance value of the PVDF element with which they are paired. They may be paired via rectification bridges—shown as 120 in the circuit diagram. These rectification bridges 120 (as shown in FIG. 1) may preferably be full-wave rectification bridges, but may alternatively be half-wave bridges. One advantage of full-wave bridges may be the ability to capture energy of both polarities. Such a matched pairing may permit maximum charge transfer from the film. Essentially, the charge transfer may preferably allow the maximum voltage generated on the PVDF film, minus two diode forward voltage drops, to be collected on the associated capacitor.

A preferred rectification block, for use with the present invention, is a full wave rectifier as this allows voltages lower in the stack to appear on both surfaces of elements higher in the stack. This configuration may also help, for example, in preventing or diminishing the effect of individual segments of piezoelectric material 130 that may convert applied voltage on one side to mechanical motion within the film in a direction contrary to applied force.

Force may be applied to the film of an embodiment of the present invention roughly perpendicular to the top surface at the center of the film, along the force line in the drawing, via an attached mass. For any applied force, a voltage may be generated across each piezoelectric element inversely proportional to the size of the element.

FIGS. 7A, 7B, and 7C are an embodiment of the present invention in which the five elements are in a single film. In, for example, rectangular areas, such as the areas for segments 711, 712, 713, 714, and 715, the elements may be defined by the application of silver ink. Care may be taken in the definition of the areas to avert the creation of parasitic capacitances, by controlling the geometry of the application.

FIGS. 8A and 8B are depictions of an embodiment of the present invention that employs a piezoelectric element 150 in a rotational setting. As such an embodiment rotates, the gravitational force on the piezoelectric element 150 changes through 360 degrees of rotation. In a situation in which gravitational attraction is 1 G, the force (in the longitudinal direction) on the element (due to gravity) will vary between 1 G (as seen in FIG. 8B) and −1 G (as seen in FIG. 8A) over the course of the rotation.

Figure 9:
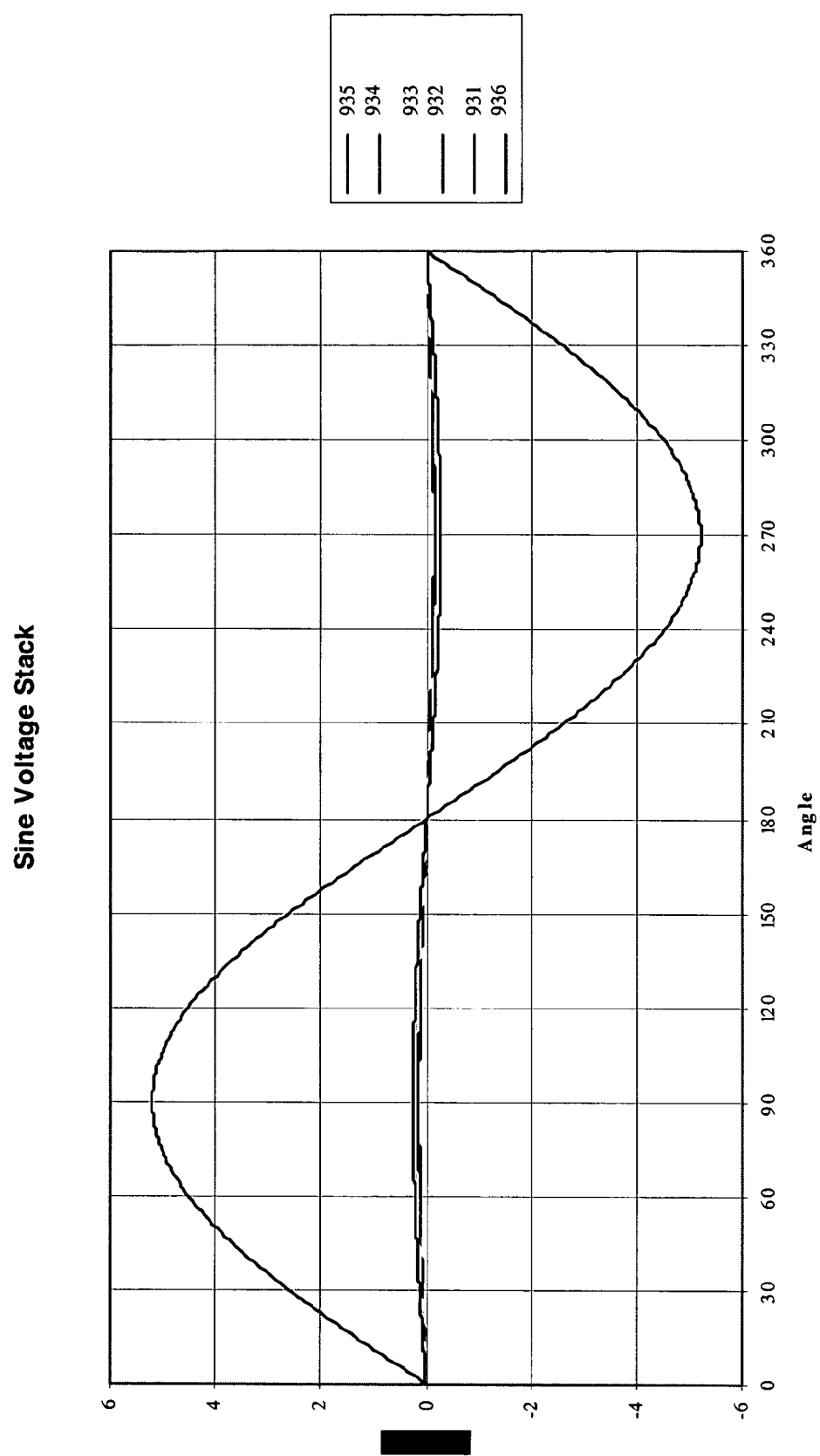
FIG. 9 is a diagram of sine wave type energy stacking of an embodiment of the present invention.

FIG. 9 is a graph of voltages output from an embodiment of the present invention including a PVDF film and stack capacitors. The voltages, in this example, are generated by a PVDF film and stored in five stack capacitors by percentage of total output. This percentage may be based on the ratio of film element capacitance to total element capacitance using the element sizing depicted in, for example, FIGS. 7A–7C. If a circuit such as the one shown in FIG. 1 is employed, the voltages across the individual capacitors 140 may vary as shown in corresponding proportional voltages (931, 932, 933, 934, and 935) depicted as waveforms. In this example, the proportional voltage 931 of the capacitor 140 connected to sensor output 170 is 25.7% of the total output voltage 936 (also depicted as a waveform). Similarly, the proportional voltage 935 of the capacitor 140 connected to ground 160 is 14.3% of total voltage 936.

Figure 10:
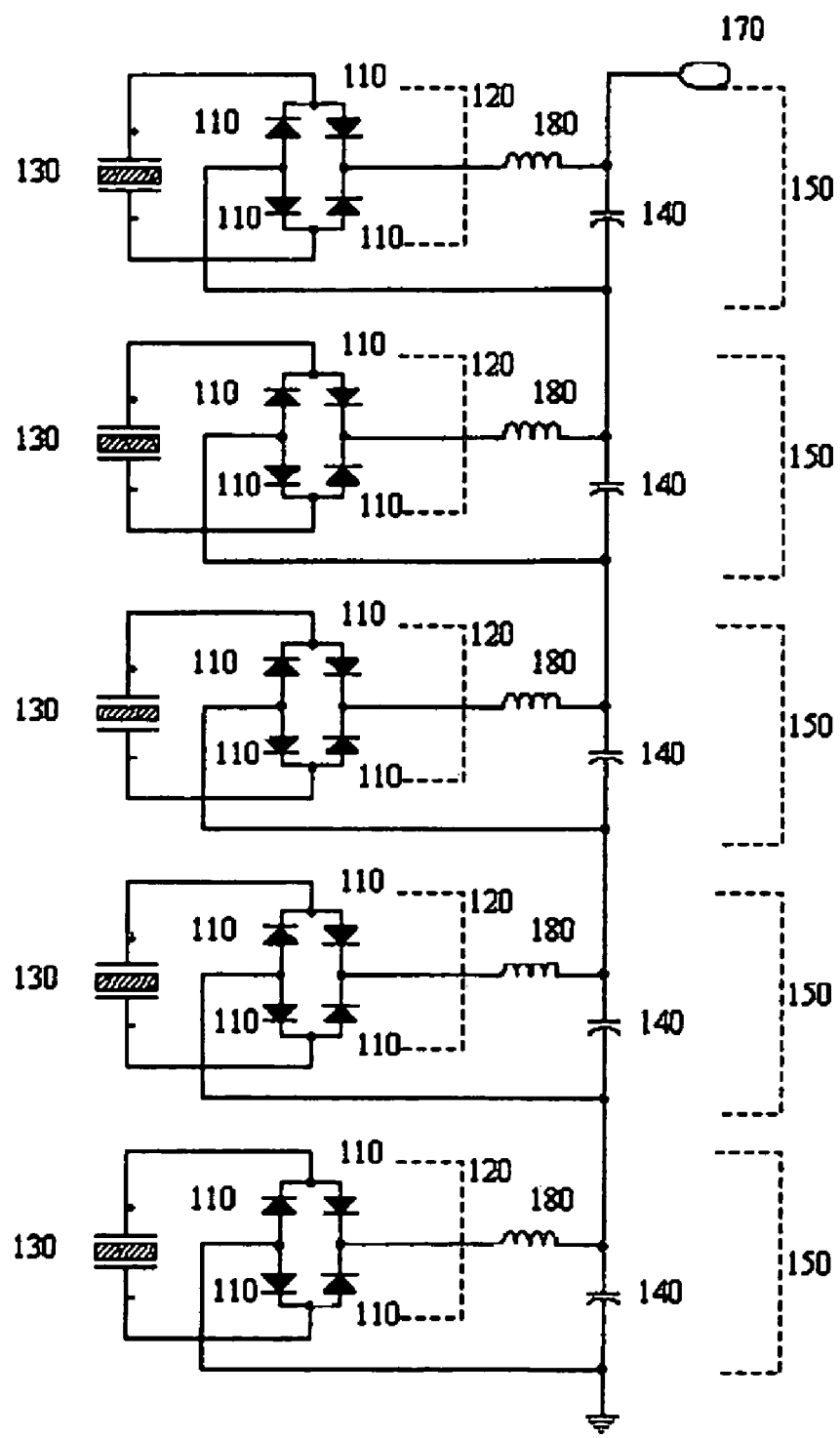
FIG. 10 is a schematic diagram of a five-element stack, with an optional signal phase delay element, such as an inductor, for example, in another embodiment of the invention.

FIG. 10 is a circuit diagram of another embodiment of the present invention. The diagram illustrates one way in which five piezoelectric elements 150 may be electrically connected together. Although the piezoelectric elements 150 are similar to each other, they are not necessarily identical. The segments of piezoelectric material 130 may be of increasing size and the capacitors 140 may be selected to correspond to the particular segment of piezoelectric material 130. An example of such an arrangement is described in FIGS. 7A, 7B, and 7C, described above. Referring again to FIG. 10, each piezoelectric element 150 may include a bridge rectifier 120. The bridge rectifier 120 may, for example, be a full-wave rectifier including four diodes 110. The bridge rectifier 120 may be connected to the piezoelectric material 130, and may be connected to a capacitor 140. Each piezoelectric element 150 may also include a signal phase delay element, such as an inductor 180, provided between each bridge rectifier 120 and said capacitive element. A stack of piezoelectric elements 150 may be connected electrically by connecting their capacitors 140 in series. One terminal of one of the capacitors 140 may be provided as a sensor output 170, and another may be connected to ground 160. It may be observed that a four-element stack may be created by removing the connection between the bottommost piezoelectric element 150 and instead connecting directly to ground.

Other embodiments of the invention will be apparent to those skilled in the art from consideration of the specification and the practice of the invention disclosed herein. It is intended that the specification and examples be considered as exemplary only, with a true scope and spirit of the invention being indicated by the following claims.

What is claimed is:

1. An apparatus for use as a sensor comprising
    a plurality of piezoelectric elements, each of said piezoelectric elements having an output,
    a rectification block on each said output of said piezoelectric elements,
    a capacitive element connected to each of said rectification blocks to accumulate charge from said rectification block,
    a signal phase delay element provided between said rectification block and said capacitive element, and
    a sensor output connected to said capacitive element to supply a signal from said capacitive element.

2. The apparatus of claim 1, further comprising a switching device connected to an output of said capacitive element.

3. The apparatus of claim 1, wherein said rectification block is selected from a group consisting of a full-wave rectification block and a half-wave rectification block.

4. The apparatus of claim 1, comprising three or more stacked piezoelectric elements.

5. The apparatus of claim 1, wherein said signal phase delay element comprises an inductor.

6. The apparatus of claim 2, wherein said switching device comprises a field effect transistor (FET).

7. The apparatus of claim 2, wherein said switching device comprises multiple field effect transistors (FETs).

8. The apparatus of claim 2, wherein said switching device comprises a bipolar transistor.

9. The apparatus of claim 2, wherein said switching device comprises multiple bipolar transistors.

10. The apparatus of claim 2, wherein said switching device comprises a relay or microelectromechancial systems (MEMS) relay.

11. The apparatus of claim 2, wherein said switching device comprises an available timer circuit.

12. The apparatus of claim 2, wherein said switching device comprises a direct micro-controller input.

13. The apparatus of claim 1, wherein said apparatus comprises a means for detecting changes in position from gravitational effects on a structure rotating at an angle to the surface of a significant gravity source.

14. The apparatus of claim 13, wherein said structure comprises a wheel.

15. The apparatus of claim 13, wherein said angle comprises approximately 90 degrees.

16. The apparatus of claim 13, wherein said gravity source comprises the earth.

17. The apparatus of claim 1, wherein said apparatus comprises means for detecting changes in position from movement of a structure the apparatus is mounted upon.

18. The apparatus of claim 1, wherein said apparatus comprises means for detecting changes in movement of a structure placed upon the apparatus.

19. The apparatus of claim 1, wherein said apparatus comprises means for detecting changes in frequency or amplitude available from a local electrical field.

20. The apparatus of claim 19, wherein said electrical field comprises a field in the approximate range of 50 to 60 Hz.

21. The apparatus of claim 1, wherein said apparatus comprises means for detecting changes in frequency or amplitude available from low power sound energy.

22. The apparatus of claim 1, wherein said apparatus comprises means for detecting changes in frequency or amplitude available from ultrasound energy.

23. The apparatus of claim 1, wherein one or more of said rectification blocks comprises a circuit board.

24. The apparatus of claim 1, wherein one or more of said capacitive elements comprises a capacitor.

25. The apparatus of claim 1, wherein said apparatus comprises means for detecting changes in ambient power available from RF spectrum energy fields.

26. The apparatus of claim 1, wherein said apparatus comprises means for detecting changes in magnetic fields.

27. An apparatus for use as a sensor comprising:
- a plurality of piezoelectric elements of different geometric sizes arranged in a stack from largest to smallest, each of said piezoelectric elements having an output,
- a rectification block on each said output of said piezoelectric elements,
- a capacitive element connected to each of said rectification blocks to accumulate charge from said rectification block, and
- a sensor output connected to said capacitive element to supply a signal from said capacitive element.

28. The apparatus of claim 27, further comprising a switching device connected to an output of said capacitive element.

29. The apparatus of claim 27, wherein said rectification block is selected from a group consisting of a full-wave rectification block and a half-wave rectification block.

30. The apparatus of claim 27, comprising three or more stacked piezoelectric elements.

31. The apparatus of claim 27, further comprising a signal phase delay element provided between said rectification block and said capacitive element.

32. The apparatus of claim 31, wherein said signal phase delay element comprises an inductor.

33. The apparatus of claim 28, wherein said switching device comprises a field effect transistor (FET).

34. The apparatus of claim 28, wherein said switching device comprises multiple field effect transistors (FETs).

35. The apparatus of claim 28, wherein said switching device comprises a bipolar transistor.

36. The apparatus of claim 28, wherein said switching device comprises multiple bipolar transistors.

37. The apparatus of claim 28, wherein said switching device comprises a relay or microelectromechancial systems (MEMS) relay.

38. The apparatus of claim 28, wherein said switching device comprises an available timer circuit.

39. The apparatus of claim 28, wherein said switching device comprises a direct micro-controller input.

40. The apparatus of claim 27, wherein said apparatus comprises a means for detecting changes in position from gravitational effects on a structure rotating at an angle to the surface of a significant gravity source.

41. The apparatus of claim 40, wherein said structure comprises a wheel.

42. The apparatus of claim 40, wherein said angle comprises approximately 90 degrees.

43. The apparatus of claim 40, wherein said gravity source comprises the earth.

44. The apparatus of claim 27, wherein said apparatus comprises means for detecting changes in position from movement of a structure the apparatus is mounted upon.

45. The apparatus of claim 27, wherein said apparatus comprises means for detecting changes in movement of a structure placed upon the apparatus.

46. The apparatus of claim 27, wherein said apparatus comprises means for detecting changes in frequency or amplitude available from a local electrical field.

47. The apparatus of claim 46, wherein said electrical field comprises a field in the approximate range of 50 to 60 Hz.

48. The apparatus of claim 27, wherein said apparatus comprises means for detecting changes in frequency or amplitude available from low power sound energy.

49. The apparatus of claim 27, wherein said apparatus comprises means for detecting changes in frequency or amplitude available from ultrasound energy.

50. The apparatus of claim 27, wherein one or more of said rectification blocks comprises a circuit board.

51. The apparatus of claim 27, wherein one or more of said capacitive elements comprises a capacitor.

52. The apparatus of claim 27, wherein said apparatus comprises means for detecting changes in ambient power available from RF spectrum energy fields.

53. The apparatus of claim 27, wherein said apparatus comprises means for detecting changes in magnetic fields.

* * * * *